United States Patent
Lu et al.

(10) Patent No.: US 12,018,400 B2
(45) Date of Patent: Jun. 25, 2024

(54) METHODS AND SYSTEMS OF CAPTURING TRANSIENT THERMAL RESPONSES OF REGIONS OF CRYSTAL PULLERS

(71) Applicant: GlobalWafers Co., Ltd., Hsinchu (TW)

(72) Inventors: Zheng Lu, O'Fallon, MO (US); Chi-Yung Chen, New Taipei (TW); Hsien-Ta Tseng, Toufen (TW); Sumeet S. Bhagavat, St. Charles, MO (US); Vahid Khalajzadeh, St. Charles, MO (US)

(73) Assignee: GlobalWafers Co., Ltd., Hsinchu (TW)

( * ) Notice: Subject to any disclaimer, the term of this patent is extended or adjusted under 35 U.S.C. 154(b) by 22 days.

(21) Appl. No.: 17/651,127

(22) Filed: Feb. 15, 2022

(65) Prior Publication Data
US 2022/0259763 A1 Aug. 18, 2022

Related U.S. Application Data

(60) Provisional application No. 63/200,119, filed on Feb. 16, 2021.

(51) Int. Cl.
*C30B 15/10* (2006.01)
*C30B 15/14* (2006.01)
*C30B 29/06* (2006.01)

(52) U.S. Cl.
CPC .............. *C30B 29/06* (2013.01); *C30B 15/10* (2013.01); *C30B 15/14* (2013.01)

(58) Field of Classification Search
CPC ......... C30B 29/06; C30B 15/10; C30B 15/14; Y10T 117/1068
See application file for complete search history.

(56) References Cited

U.S. PATENT DOCUMENTS

| 5,037,621 A | 8/1991 | Kennedy et al. |
| 5,408,952 A | 4/1995 | Wakabayashi et al. |
| (Continued) | | |

FOREIGN PATENT DOCUMENTS

| CN | 2900558 Y | 5/2007 |
| CN | 102134739 A | 7/2011 |
| (Continued) | | |

OTHER PUBLICATIONS

International Search Report and Written Opinion issued for PCT/US2022/016475, dated May 24, 2022 (16 pages).

*Primary Examiner* — Robert M Kunemund
(74) *Attorney, Agent, or Firm* — Armstrong Teasdale LLP

(57) ABSTRACT

A system for producing a silicon ingot, the system includes a crystal puller, a pyrometer, an infrared (IR) camera, and a controller. The crystal puller includes a hot zone having one or more components therein, and in which a silicon ingot may be pulled. The pyrometer is positioned to view a region of interest within the hot zone. The IR camera is positioned to view one or more additional regions of interest within the hot zone. The controller is connected to the crystal puller, the pyrometer, and the IR camera. The controller is programmed to control the crystal puller to produce a silicon ingot, receive temperature data of the region of interest within the hot zone from the pyrometer while producing the silicon ingot, and receive IR images of the one or more additional regions of interest from the IR camera while producing the silicon ingot.

8 Claims, 15 Drawing Sheets

(56) References Cited

U.S. PATENT DOCUMENTS 6,960,254 B2    11/2005  Lu
2005/0016443 A1*  1/2005  Lu .......................... C30B 29/06
                                                             117/14

FOREIGN PATENT DOCUMENTS

JP          H07243911 A      9/1995
JP            03628823 B2    3/2005
JP             5957145   *   6/2016

* cited by examiner

METHODS AND SYSTEMS OF CAPTURING TRANSIENT THERMAL RESPONSES OF REGIONS OF CRYSTAL PULLERS

CROSS-REFERENCE TO RELATED APPLICATIONS

This application claims priority to U.S. Provisional Patent Application Ser. No. 63/200,119, filed Feb. 16, 2021, the entire disclosure of which is hereby incorporated by reference in its entirety.

FIELD

This disclosure generally relates to crystal pullers and the production of monocrystalline ingots, and more specifically, to methods and systems for capturing transient thermal responses of regions in a crystal puller.

BACKGROUND

Monocrystalline ingots are produced in a crystal puller under high temperatures and vacuum conditions. The temperature of the crystal, the melt from which the crystal is pulled, and components within the crystal puller affect the production of the silicon ingot. During the production of a silicon ingot these temperatures change as conditions and variables change. Currently, there is no practical, reliable, and accurate method to measure the transient properties of the temperature fields inside a crystal puller. In particular, there are no such methods for measuring transient properties of temperature fields of the silicon ingot (also referred to herein as a crystal), the melt from which the ingot is pulled, or surfaces within the hot zone of the crystal puller. The common contact or non-contact measurement methods have difficulties in measuring static temperature fields in the crystal furnaces and hot zones, let alone the transient properties of such temperature fields.

In one known method, for example, a pyrometer is utilized to monitor the crystal surface temperature of one selected point. This measurement can be used together with the crystal pull rate to calculate the cooling and quenching rates over time. Such method can only capture the temperature of one point, and it is not capable of capturing complete information on temperature fields or transient properties.

This background section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

BRIEF SUMMARY

One aspect of the present disclosure is a system for producing an ingot, the system includes a crystal puller, a pyrometer, an infrared (IR) camera, and a controller. The crystal puller includes a hot zone having one or more components therein, and in which a silicon ingot may be pulled. The pyrometer is positioned to view a region of interest within the hot zone. The IR camera is positioned to view one or more additional regions of interest within the hot zone. The controller is connected to the crystal puller, the pyrometer, and the IR camera. The controller is programmed to control the crystal puller to produce a silicon ingot, receive temperature data of the region of interest within the hot zone from the pyrometer while producing the silicon ingot, and receive IR images of the one or more additional regions of interest from the IR camera while producing the silicon ingot.

In another aspect, a system for producing a silicon ingot includes a crystal puller, a pyrometer, an infrared (IR) camera, and a controller. The crystal puller includes a hot zone having a plurality of components therein, and in which a silicon ingot may be pulled. The pyrometer is positioned to view a region of interest within the hot zone. The IR camera is positioned to view one or more additional regions of interest within the hot zone. The controller is connected to the crystal puller, pyrometer, and the IR camera. The controller is programmed to control the crystal puller to introduce a step change to a characteristic of one or more component of the plurality of components. The controller is programmed to perform one or both of receiving temperature data of the region of interest within the hot zone from the pyrometer before, during, and after the step change to the characteristic is introduced, and receiving IR images of the one or more additional regions of interest from the IR camera before, during, and after the step change to the characteristic is introduced.

Another aspect of this disclosure is a method. The method includes positioning a pyrometer to view a region of interest within a hot zone of a crystal puller, the hot zone of the crystal puller having a first configuration including a first plurality of components therein. An infrared (IR) camera is positioned to view one or more additional regions of interest within the hot zone. The crystal puller is controlled to introduce a step change to a characteristic of one or more component of the plurality of components. The method includes one or both of: receiving first temperature data of the region of interest within the hot zone from the pyrometer before, during, and after the step change to the characteristic is introduced; and receiving first IR images of the one or more additional regions of interest from the IR camera before, during, and after the step change to the characteristic is introduced. At least one component within the hot zone of the crystal puller is changed to produce a second configuration of the hot zone having a second plurality of components. The crystal puller is controlled to reintroduce the step change to the characteristic in the second configuration of the hot zone. The method includes performing one or both of: receiving second temperature data of the region of interest within the hot zone from the pyrometer before, during, and after the step change to the characteristic is reintroduced to the second configuration of the hot zone, and receiving second IR images of the one or more additional regions of interest from the IR camera before, during, and after the step change to the characteristic is reintroduced to the second configuration of the hot zone.

Various refinements exist of the features noted in relation to the above-mentioned aspect. Further features may also be incorporated in the above-mentioned aspect as well. These refinements and additional features may exist individually or in any combination. For instance, various features discussed below in relation to any of the illustrated embodiments may be incorporated into the above-described aspect, alone or in any combination.

BRIEF DESCRIPTION OF THE DRAWINGS

Like reference symbols in the various drawings indicate like elements.

DETAILED DESCRIPTION

Figure 1:
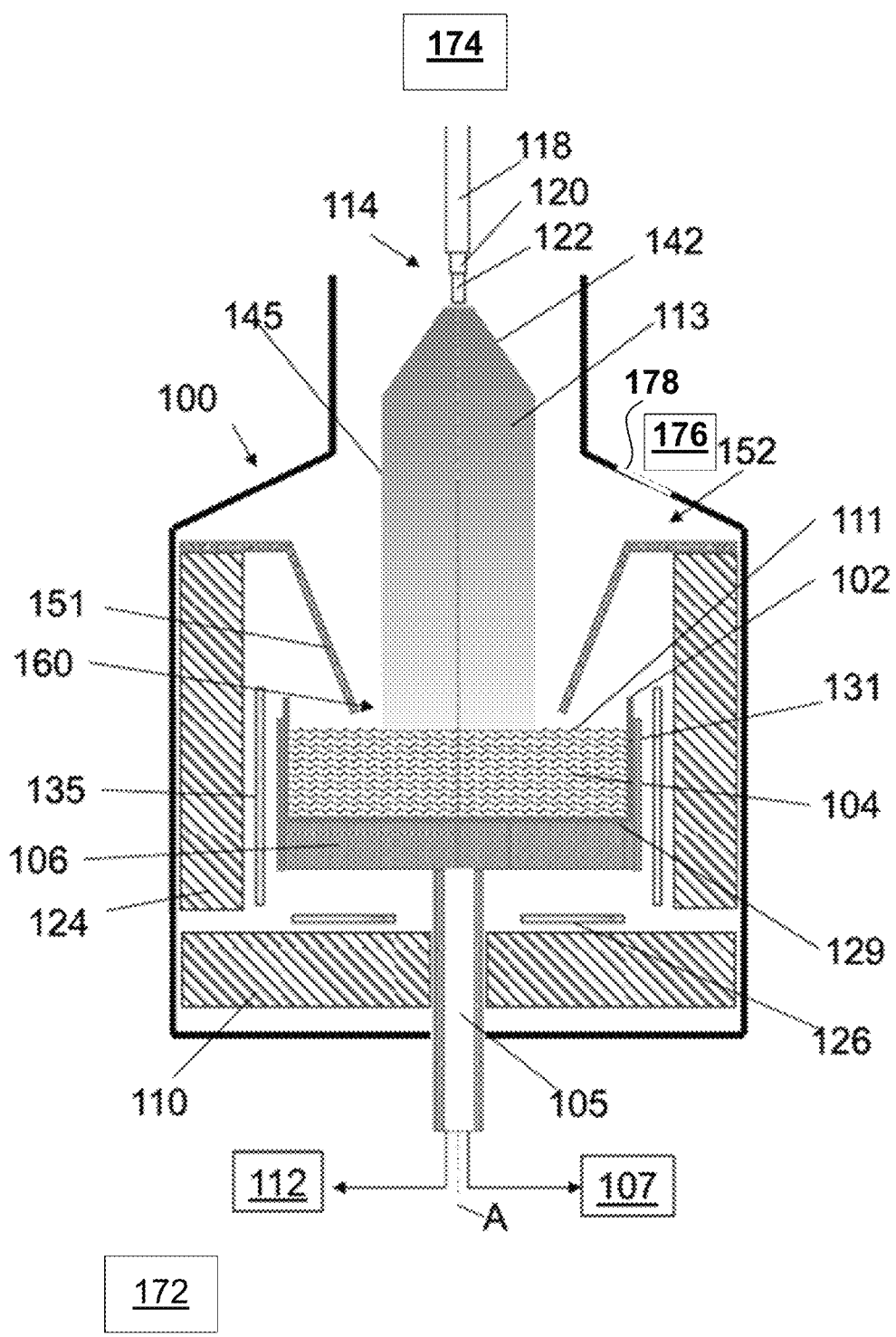
FIG. 1 is a cross-section view of an ingot puller apparatus used to pull a single crystal ingot from a silicon melt.

An ingot puller apparatus (or more simply "ingot puller" or a "crystal puller") for growing a monocrystalline ingot is indicated generally at "100" in FIG. 1. The ingot puller apparatus 100 includes a crystal puller housing 108 that defines a growth chamber 152 for pulling an ingot 113 from a melt 104 of silicon or similar semiconductor material. A control system 172 (also referred to as a "controller") controls operation of the ingot puller 100 and its components. The ingot puller apparatus 100 includes a crucible 102 disposed within the growth chamber 152 for holding the melt 104 of silicon. The crucible 102 is supported by a susceptor 106.

The crucible 102 includes a floor 129 and a sidewall 131 that extends upward from the floor 129. The sidewall 131 is generally vertical. The floor 129 includes the curved portion of the crucible 102 that extends below the sidewall 131. Within the crucible 102 is a silicon melt 104 having a melt surface 111 (i.e., melt-ingot interface). The susceptor 106 is supported by a shaft 105. The susceptor 106, crucible 102, shaft 105 and ingot 113 have a common longitudinal axis A or "pull axis" A.

A pulling mechanism 114 is disposed within the ingot puller apparatus 100 for growing and pulling an ingot 113 from the melt 104. Pulling mechanism 114 includes a pulling cable 118, a seed holder or chuck 120 coupled to one end of the pulling cable 118, and a seed crystal 122 coupled to the seed holder or chuck 120 for initiating crystal growth. One end of the pulling cable 118 is connected to a pulley (not shown) or a drum (not shown), or any other suitable type of lifting mechanism, for example, a shaft, and the other end is connected to the chuck 120 that holds the seed crystal 122. In operation, the seed crystal 122 is lowered to contact the melt 104. The pulling mechanism 114 is operated to cause the seed crystal 122 to rise. This causes a single crystal ingot 113 to be pulled from the melt 104.

During heating and crystal pulling, a crucible drive unit 107 (e.g., a motor) rotates the crucible 102 and susceptor 106. A lift mechanism 112 raises and lowers the crucible 102 along the pull axis A during the growth process. As the ingot grows, the silicon melt 104 is consumed and the height of the melt in the crucible 102 decreases. The crucible 102 and susceptor 106 may be raised to maintain the melt surface 111 at or near the same position relative to the ingot puller apparatus 100.

A crystal drive unit (not shown) may also rotate the pulling cable 118 and ingot 113 in a direction opposite the direction in which the crucible drive unit 107 rotates the crucible 102 (e.g., counter-rotation). In embodiments using iso-rotation, the crystal drive unit may rotate the pulling cable 118 in the same direction in which the crucible drive unit 107 rotates the crucible 102. In addition, the crystal drive unit raises and lowers the ingot 113 relative to the melt surface 111 as desired during the growth process.

The ingot puller apparatus 100 may include an inert gas system to introduce and withdraw an inert gas such as argon from the growth chamber 152. The ingot puller apparatus 100 may also include a dopant feed system (not shown) for introducing dopant into the melt 104.

According to the Czochralski single crystal growth process, a quantity of polycrystalline silicon, or polysilicon, is charged to the crucible 102 (e.g., charge of 250 kg or more). A variety of sources of polycrystalline silicon may be used including, for example, granular polycrystalline silicon produced by thermal decomposition of silane or a halosilane in a fluidized bed reactor or polycrystalline silicon produced in a Siemens reactor. Once polycrystalline silicon is added to the crucible to form a charge, the charge is heated to a temperature above about the melting temperature of silicon (e.g., about 1412° C.) to melt the charge. In some embodiments, the charge (i.e., the resulting melt) is heated to a temperature of at least about 1425° C., at least about 1450° C. or even at least about 1500° C. The ingot puller apparatus 100 includes bottom insulation 110 and side insulation 124 to retain heat in the puller apparatus 100. In the illustrated embodiment, the ingot puller apparatus 100 includes a bottom heater 126 disposed below the crucible floor 129. The crucible 102 may be moved to be in relatively close proximity to the bottom heater 126 to melt the polycrystalline charged to the crucible 102.

To form the ingot, the seed crystal 122 is contacted with the surface 111 of the melt 104. The pulling mechanism 114 is operated to pull the seed crystal 122 from the melt 104. The ingot 113 includes a crown portion 142 in which the ingot transitions and tapers outward from the seed crystal 122 to reach a target diameter. The ingot 113 includes a constant diameter portion 145 or cylindrical "main body" of the crystal which is grown by increasing the pull rate. The main body 145 of the ingot 113 has a relatively constant diameter. The ingot 113 includes a tail or end-cone (not shown) in which the ingot tapers in diameter after the main body 145. When the diameter becomes small enough, the ingot 113 is then separated from the melt 104. The ingot 113 has a central longitudinal axis A that extends through the crown portion 142 and a terminal end of the ingot 113.

The ingot puller apparatus 100 includes a side heater 135 and a susceptor 106 that encircles the crucible 102 to maintain the temperature of the melt 104 during crystal growth. The side heater 135 is disposed radially outward to the crucible sidewall 131 as the crucible 102 travels up and down the pull axis A. The side heater 135 and bottom heater 126 may be any type of heater that allows the side heater 135 and bottom heater 126 to operate as described herein. In some embodiments, the heaters 135, 126 are resistance heaters. The side heater 135 and bottom heater 126 may be controlled by a control system 172 so that the temperature of the melt 104 is controlled throughout the pulling process.

The ingot puller apparatus 100 also includes a reflector 151 (or "heat shield") disposed within the growth chamber 152 and above the melt 104 which shrouds the ingot 113 during ingot growth. The reflector 151 may be partially disposed within the crucible 102 during crystal growth. The heat shield 151 defines a central passage 160 for receiving the ingot 113 as the ingot is pulled by the pulling mechanism 114.

Figure 2:
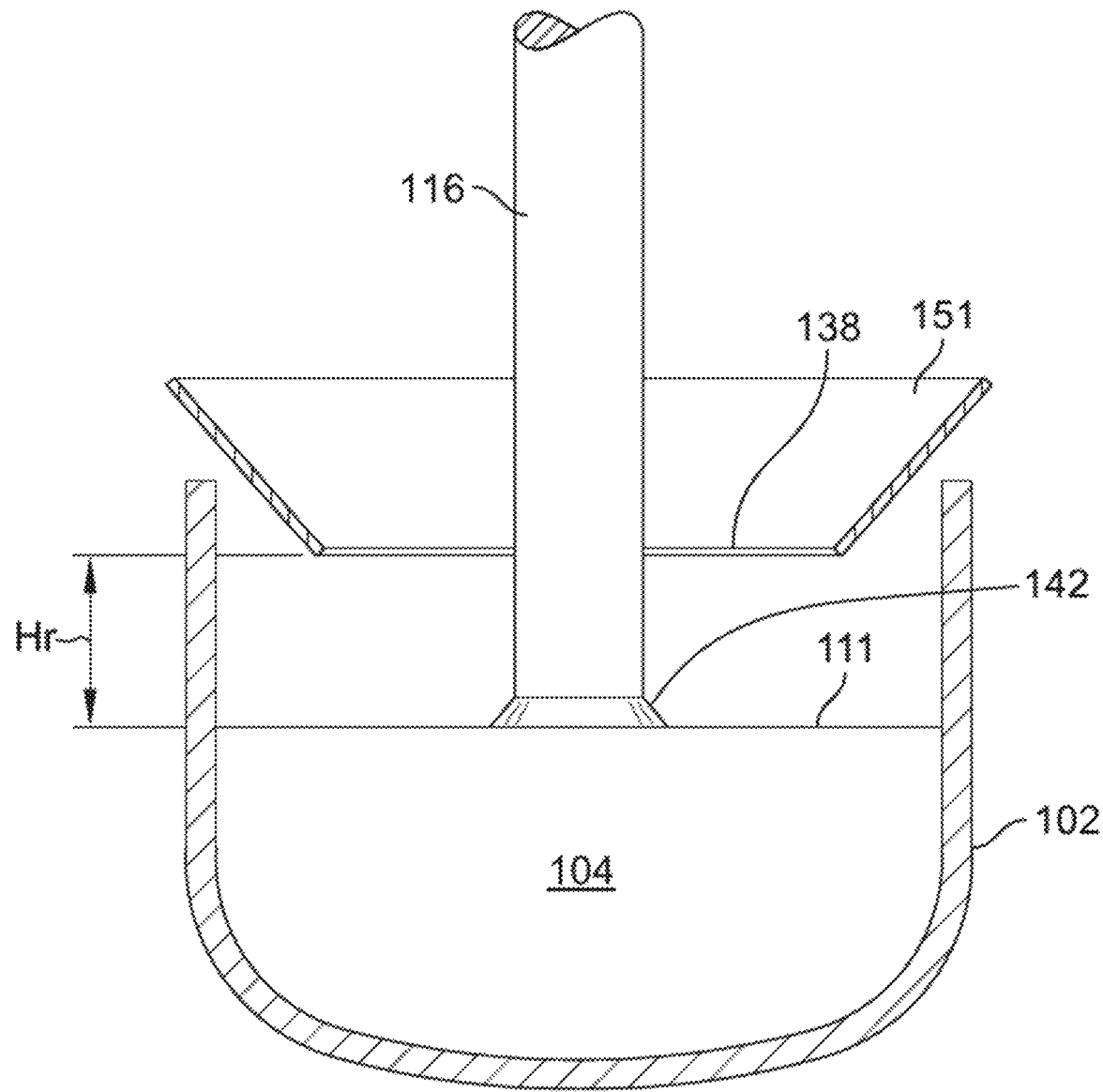
FIG. 2 is a cross-section of an ingot puller apparatus.

The reflector 151 is, in general, a heat shield adapted to retain heat underneath itself and above the melt 104. In this regard, any reflector design and material of construction (e.g., graphite or gray quartz) known in the art may be used without limitation. The reflector 151 has a bottom 138 (FIG. 2) and the bottom 138 of the reflector 151 is separated from the surface of the melt by a distance HR during ingot growth.

A pyrometer 174 and an infrared (IR) camera 176 are positioned to view selected regions of the hot zone (i.e., lower portion of the growth chamber 152 such as the crucible 102 and the susceptor 106), crystal ingot 113, or melt 104 during production of a silicon crystal ingot. The pyrometer 174 and the IR camera 176 are sometimes referred to collectively herein as a temperature monitoring system.

The pyrometer 174 is typically chosen for its ability to measure temperature across a range of temperatures desired to be monitored by the pyrometer. In one example, the pyrometer 174 is operable to measure temperatures from 700° C. to 3500° C. In another example, the pyrometer 174 is operable to measure temperatures between from 200° C. to 1400° C. These example pyrometers may include two different sensors, one to measure temperature and the other to measure emissivity. Other embodiments may include a pyrometer camera 174 operable to measure temperatures across any other suitable range of temperatures, including a wider range of temperatures or a narrower range of temperatures.

The IR camera 176 is also typically chosen for its ability to measure temperature within the range of temperatures to be monitored by the IR camera 176. In one example, the IR camera 176 can measure temperatures from 600° C. to 1600° C. In another embodiment, the IR camera 176 is operable to measure temperature between 800° C. and 3000° C. Other embodiments may include an IR camera 176 operable to measure temperatures across any other suitable range of temperatures, including a wider range of temperatures or a narrower range of temperatures.

The pyrometer 174 is mounted at the top of the puller 100 and aligned along a central axis A of the crystal puller 100 and the ingot 113. In the example embodiment, the pyrometer 174 is mounted to a portion of the pulling mechanism 114. From this position, the pyrometer 174 can view at least portions of the susceptor 106, the melt surface 111, the crystal ingot 113, and the reflector 151. Portions of the crystal puller 100 may block the view of the pyrometer 174 during operation. Thus, the pyrometer may be aimed and, if necessary, re-aimed at the location to be monitored during a crystal pulling operation.

The IR camera 176 is positioned to view the interior of the growth chamber 152 through a viewport 178, which may be an operator viewport or any other portion through which IR light may pass. The IR camera 176 can view at least portions of the melt 104, the surface of the crystal ingot 113, and the reflector 151 through the viewport 178. In the example embodiment, the IR camera 176 captures images in the near infrared wavelength range between about 780 nm to 1080 nm. In other embodiments, images in any other suitable IR wavelength or range of IR wavelengths may be captured by the IR camera 176. In the example embodiment, the IR camera 176 is mounted to a three-axis geared camera head (not shown) to allow the IR camera to be adjusted into a desired position and held in that position constantly or consistently moved to that desired position repeatedly as desired. In some embodiments, the IR camera 176 and the pyrometer 174 may be calibrated to align common regions viewed by both the IR camera 176 and the pyrometer 174.

Figure 3:
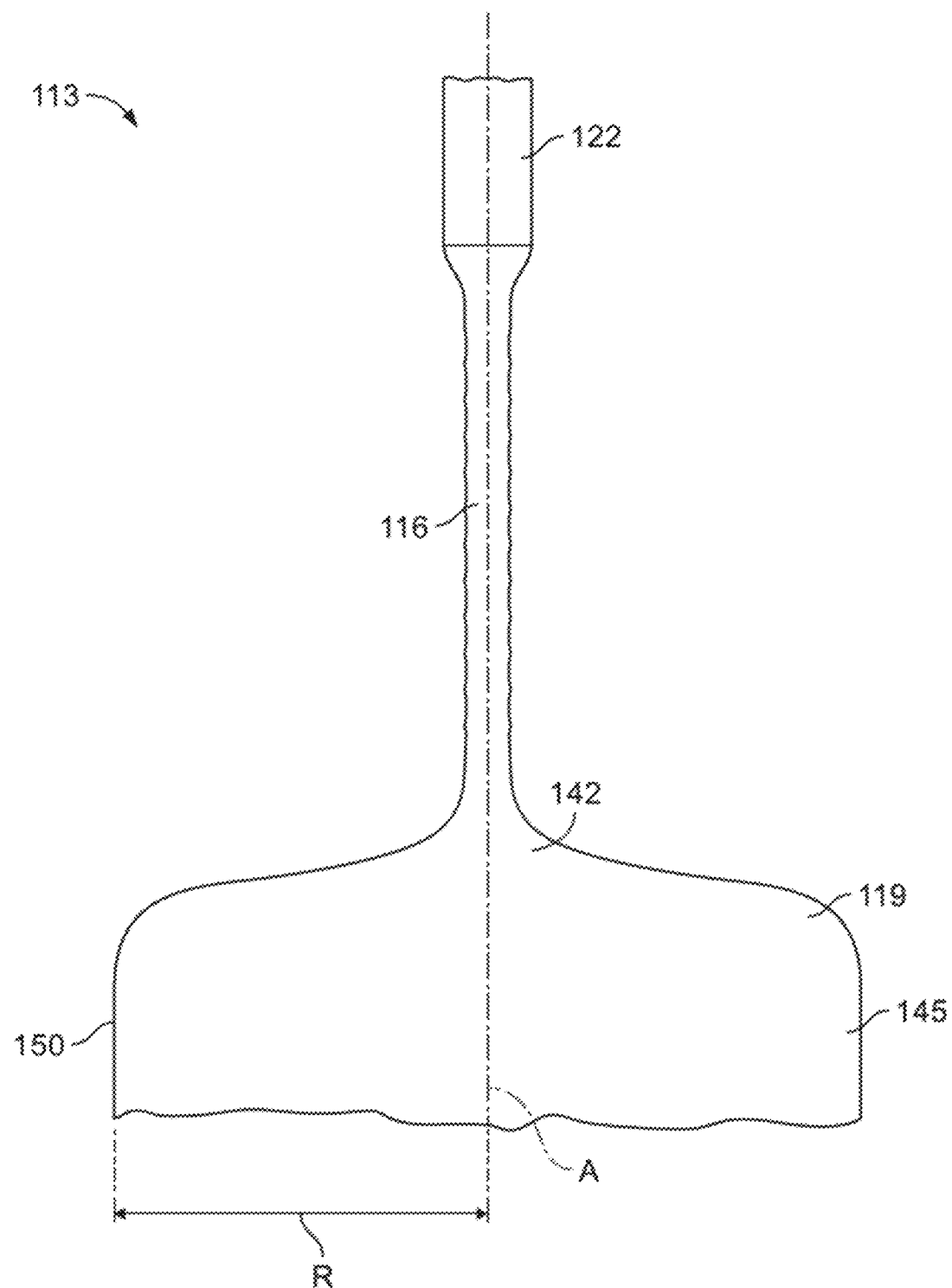
FIG. 3 is a partial front view of a single crystal silicon ingot grown by the Czochralski method.

A single crystal silicon ingot 113 produced in accordance with embodiments of the present disclosure and, generally, the Czochralski method is shown in FIG. 3. The ingot 113 includes a neck 116, an outwardly flaring portion 142 (synonymously "crown" or "cone"), a shoulder 119 and a constant diameter main body 145. The neck 116 is attached to the seed crystal 122 that was contacted with the melt and withdrawn to form the ingot 113. The main body 145 is suspended from the neck 116. The neck 116 terminates once the cone portion 142 of the ingot 113 begins to form.

As seen in FIG. 3, the constant diameter portion 145 of the ingot 113 has a circumferential edge 150. The central axis A is parallel to the circumferential edge 150 and a radius R extends from the central axis A to the circumferential edge 145. The central axis A also passes through the cone 142 and neck 116. The diameter (i.e., twice the radius R) of the main ingot body 145 may vary and, in some embodiments, the diameter may be about 150 mm, about 200 mm, about 300 mm, greater than about 300 mm, about 450 mm or even greater than about 450 mm.

The single crystal silicon ingot 113 may generally have any resistivity. The single crystal silicon ingot 113 may be doped or undoped.

Figure 4:
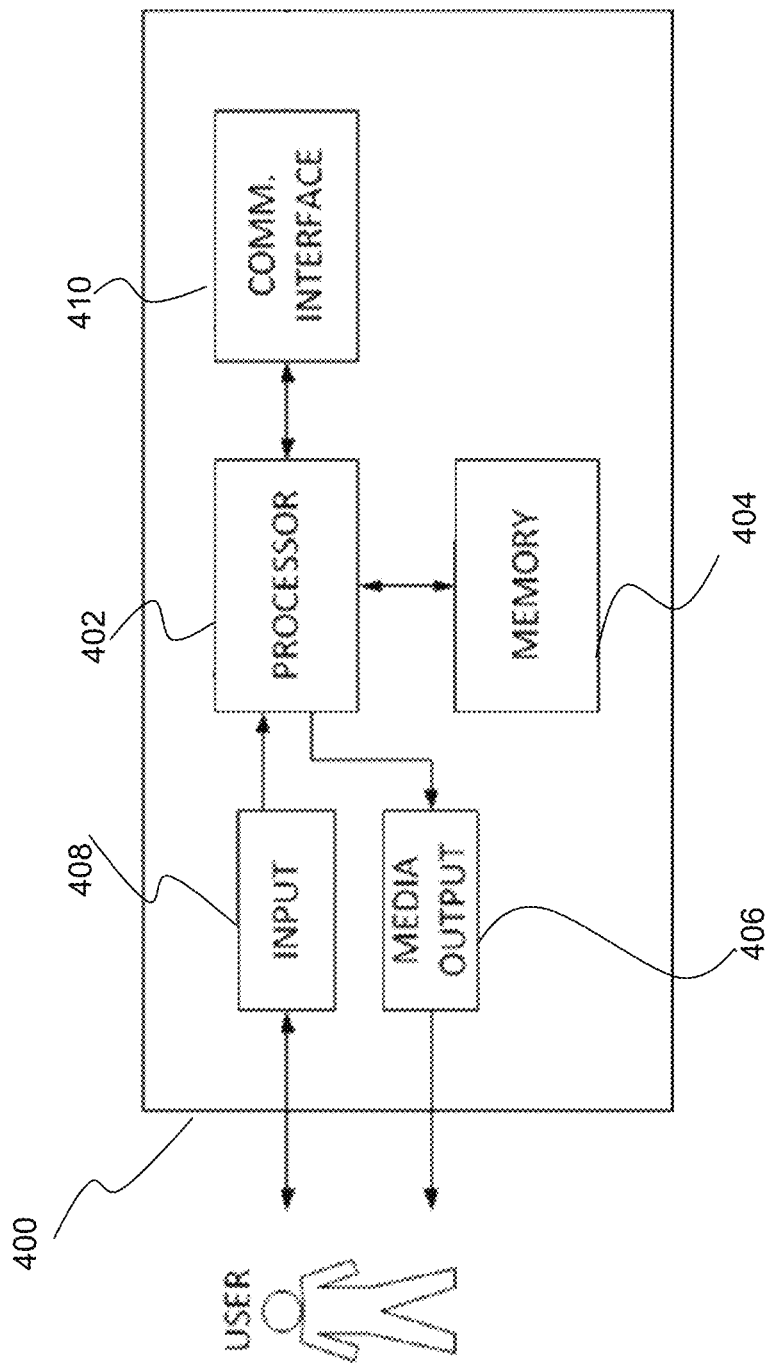
FIG. 4 is a block diagram of a computing device for use in the control system of the ingot puller apparatus of FIG. 1.

FIG. 4 is an example computing device 400 that may be used as or as part of the control system 172. The computing device 400 includes a processor 402, a memory 404, a media output component 406, an input device 408, and a communications interface 410. Other embodiments include different components, additional components, and/or do not include all components shown in FIG. 4. Moreover, some embodiments include a computing device 400 separate (and in addition to) the control system 172. The separate computing device 400 may be used, for example, to receive and process data (for example, as acquired using the techniques described herein), to perform crystal pulling simulations, and to adjust simulation parameters based on the received data.

The processor 402 is configured for executing instructions. In some embodiments, executable instructions are stored in the memory 404. The processor 402 may include one or more processing units (e.g., in a multi-core configuration). The term processor, as used herein, refers to central processing units, microprocessors, microcontrollers, reduced instruction set circuits (RISC), application specific integrated circuits (ASIC), a programmable logic circuit (PLC), and any other circuit or processor capable of executing the functions described herein. The above are examples only, and are thus not intended to limit in any way the definition and/or meaning of the term "processor."

The memory 404 stores non-transitory, computer-readable instructions for performance of the techniques described herein. Such instructions, when executed by the processor 402, cause the processor 402 to perform at least a portion of the methods described herein. In some embodiments, the memory 404 stores computer-readable instructions for providing a user interface to the user via media output component 406 and, receiving and processing input from input device 408. The memory 404 may include, but is not limited to, random access memory (RAM) such as dynamic RAM (DRAM) or static RAM (SRAM), read-only memory (ROM), erasable programmable read-only memory (EPROM), electrically erasable programmable read-only memory (EEPROM), and non-volatile RAM (NVRAM). Although illustrated as separate from the processor 402, in some embodiments the memory 404 is combined with the processor 402, such as in a microcontroller or microprocessor, but may still be referred to separately. The above memory types are example only, and are thus not limiting as to the types of memory usable for storage of a computer program.

The media output component 406 is configured for presenting information to the user (e.g., the operator of the system). The media output component 406 is any component capable of conveying information to the user. In some embodiments, the media output component 406 includes an output adapter such as a video adapter and/or an audio adapter. The output adapter is operatively connected to the processor 402 and operatively connectable to an output device such as a display device (e.g., a liquid crystal display (LCD), light emitting diode (LED) display, organic light emitting diode (OLED) display, cathode ray tube (CRT), "electronic ink" display, one or more light emitting diodes (LEDs)) or an audio output device (e.g., a speaker or headphones).

The computing device 400 includes, or is connected to, the input device 408 for receiving input from the user. The input device 408 is any device that permits the computing device 400 to receive analog and/or digital commands, instructions, or other inputs from the user, including visual, audio, touch, button presses, stylus taps, etc. The input device 408 may include, for example, a variable resistor, an input dial, a keyboard/keypad, a pointing device, a mouse, a stylus, a touch sensitive panel (e.g., a touch pad or a touch screen), a gyroscope, an accelerometer, a position detector, an audio input device, or any combination thereof. A single component such as a touch screen may function as both an output device of the media output component 406 and the input device 408.

The communication interface enables the computing device 400 to communicate with remote devices and systems, such as remote sensors, remote databases, remote computing devices, and the like, and may include more than one communication interface for interacting with more than one remote device or system. The communication interfaces may be wired or wireless communications interfaces that permit the computing device 400 to communicate with the remote devices and systems directly or via a network. Wireless communication interfaces may include a radio frequency (RF) transceiver, a Bluetooth® adapter, a Wi-Fi transceiver, a ZigBee® transceiver, a near field communication (NFC) transceiver, an infrared (IR) transceiver, and/or any other device and communication protocol for wireless communication. (Bluetooth is a registered trademark of Bluetooth Special Interest Group of Kirkland, Washington; ZigBee is a registered trademark of the ZigBee Alliance of San Ramon, California) Wired communication interfaces may use any suitable wired communication protocol for direct communication including, without limitation, USB, RS232, I2C, SPI, analog, and proprietary I/O protocols. In some embodiments, the wired communication interfaces include a wired network adapter allowing the computing device 400 to be coupled to a network, such as the Internet, a local area network (LAN), a wide area network (WAN), a mesh network, and/or any other network to communicate with remote devices and systems via the network.

The computer systems discussed herein may include additional, less, or alternate functionality, including that discussed elsewhere herein. The computer systems discussed herein may include or be implemented via computer-executable instructions stored on non-transitory computer-readable media or medium.

The IR camera 176 and the pyrometer 174 are used to monitor the surface temperatures of selected parts of hot zone, crystal, or melt continuously. The monitored temperatures can be used to monitor temperatures of regions of interest during the silicon ingot 113 pulling process. These monitored temperatures may be compared to simulated temperatures and used to calibrate and improve simulations for the crystal pulling process. Further, in some embodiments, step change or a series of step changes may be introduced in chosen process conditions such as the power of heaters 135 and 126, the position of crucible 102 and the position of the reflector 151, and the like, while capturing temperatures of selected regions using the IR camera 176 and the pyrometer 174. By doing so, the transient properties of the temperature fields induced by such step changes can be captured and compared among different hot zones and processes. These include but not limited to changes in surface temperatures induced by heating or cooling effects from key hot zone components through radiation and conduction at certain predetermined positions. Quantitatively capturing these transient properties may help in designing efficient hot zones and crystal processes.

Figure 5:
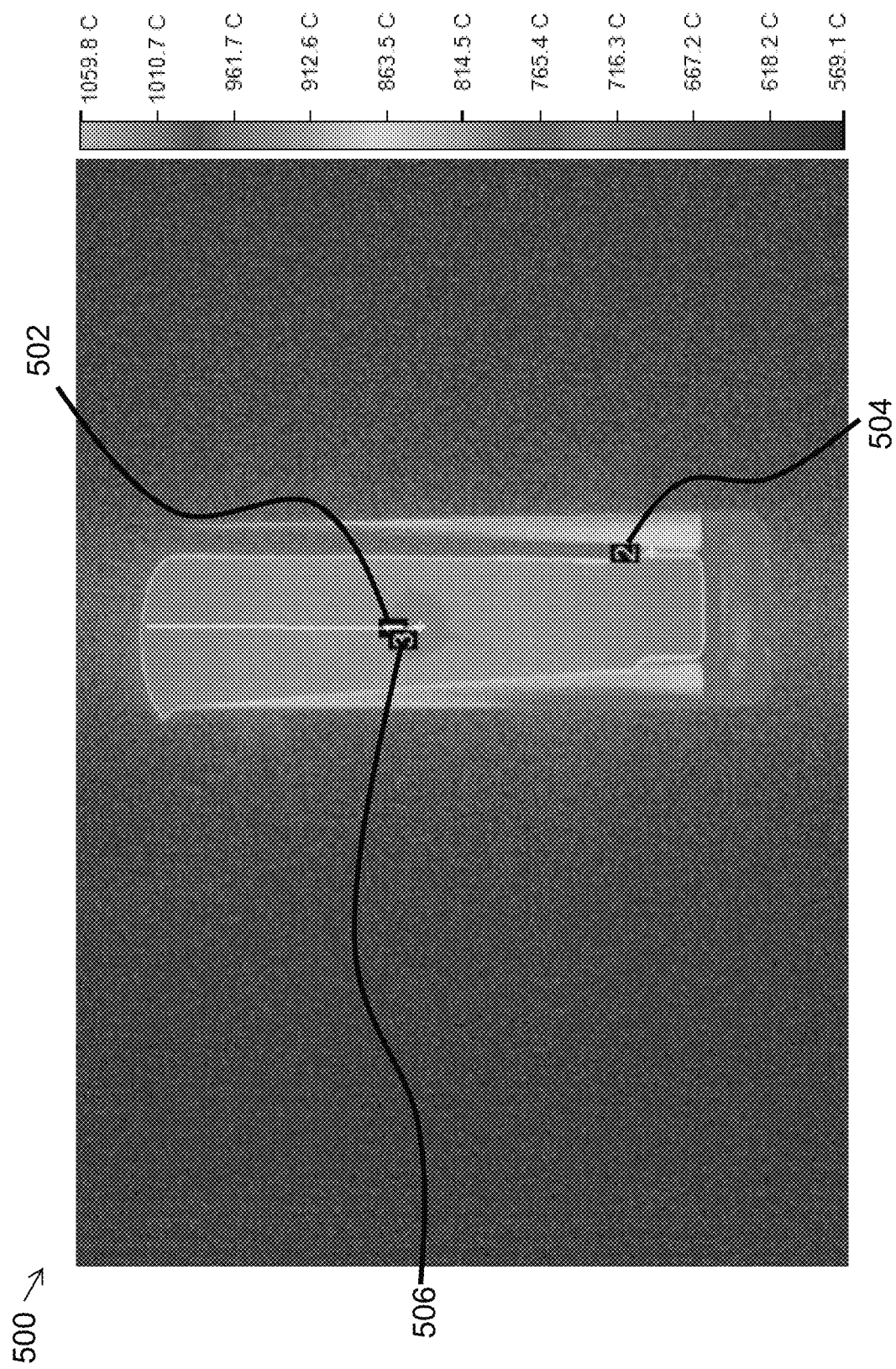
FIG. 5 is an example image captured by an IR camera in the ingot puller apparatus of FIG. 1.

FIG. 5 is an example image 500 captured by the IR camera 176. In the image 500, there are three regions of interest marked. The first region 502, is the center of the susceptor 106. The second region 504 is a portion of the reflector 151, such as a notch in the reflector 151. The third region 506 is the region of a straight line connecting the first region 502 and on outer edge of the susceptor 106. Temperature profiles and gradient profiles of regions of interest (e.g., first region 502, second region 504, and third region 506) may be extracted from the images (such as example image 500) captured by the IR camera 176.

Figure 6:
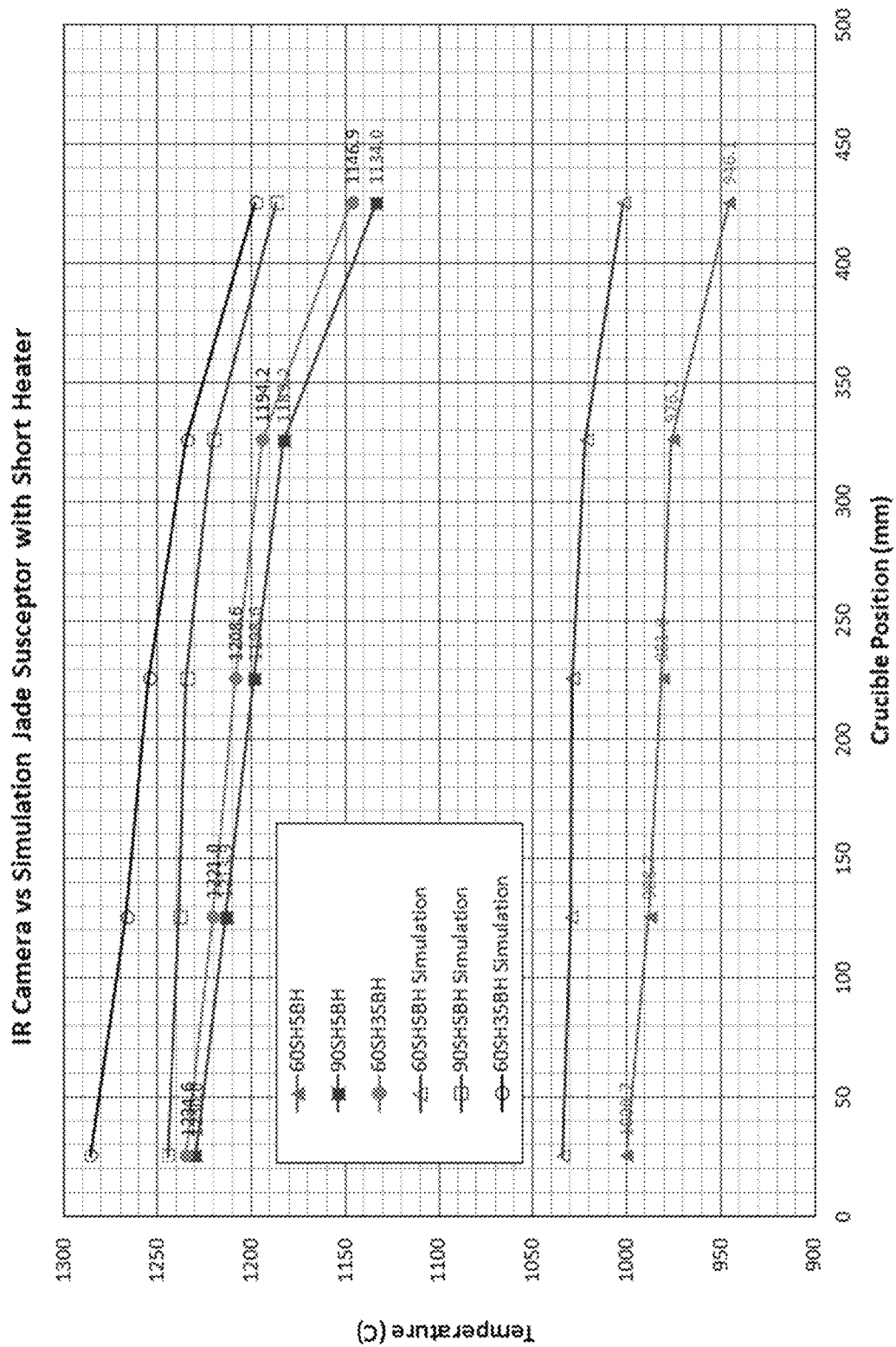
FIG. 6 is a graph of temperatures profiles of the first region in the ingot puller apparatus of FIG. 1 measured with the IR camera at three different combinations of crucible height and heater powers, and simulated temperature profiles for the same region and combinations.
Figure 7:
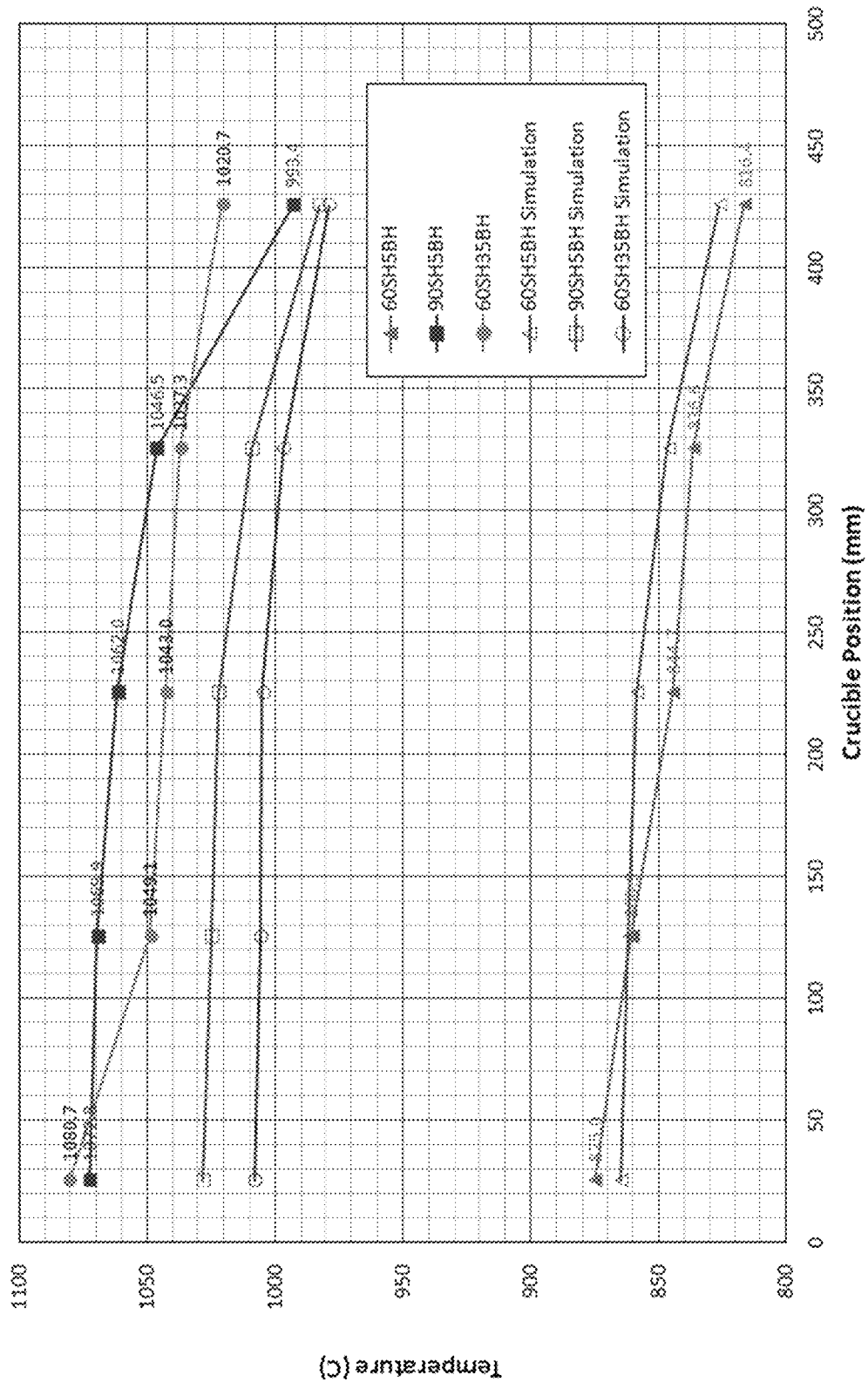
FIG. 7 is a graph of temperatures profiles of a second region in the ingot puller apparatus of FIG. 1 measured with the IR camera at three different combinations of crucible height and heater power, and simulated temperature profiles for the same region and combinations.

With reference to FIGS. 6 and 7, data collected from the IR camera 176 and the pyrometer 174 may be used to provide calibration reference for thermal simulation and to improve its accuracy and reduce errors from input properties such as thermal conductivities of hot zone materials and the like. FIG. 6 is a graph of temperatures profiles of the first region 502 (i.e., the center of the susceptor 106—shown in FIG. 5) measured with the IR camera 176 at three different combinations of crucible 102 height and heater 135, 126 powers, and simulated temperature profiles for the same region and combinations. FIG. 7 is a graph of temperatures profiles of the second region 504 (i.e., the portion of the reflector 151—shown in FIG. 5) measured with the IR camera 176 at three different combinations of crucible 102 height and heater 135, 126 power, and simulated temperature profiles for the same region and combinations. In FIGS. 6 and 7, the temperature profiles measured by the IR camera 176 follow the trends of the simulated temperature profiles very well but exhibit constant bias. Thus, by using the data acquired from the IR camera 176, such bias can be eliminated or reduced by modifying input property while calibrating against temperature profiles measured by the IR camera 176. As a result, more accurate simulated temperature profiles my then be produced as needed.

Although the data discussed above was captured using the IR camera 176, the same techniques may be applied to data acquired using the pyrometer 174. The IR camera 176 and the pyrometer 174 may be used to capture temperature data about the same points in the crystal puller 100, or may each capture data about different points in the crystal puller. In some embodiments, the IR camera 176 is used to capture temperatures of multiple chosen spots at certain time or within a short period of time, and the pyrometer 174 is used to capture the temperatures of one particular spot for a relatively long period of time. Additional examples are described below with reference to temperature data acquired by pyrometer 174, but similar data may be acquired using the IR camera 176 (additionally or alternatively) and used for similar purposes.

The temperature monitoring system may be used to monitor temperature transients within the crystal puller 100 in response to step changes in one or more variables of operation of the crystal puller 100. That is, the one or both of the IR camera 176 and the pyrometer 174 may collect temperature data of regions of interest within the crystal puller 100 while controlled variables of the crystal puller 100 (such as crucible height, the power of the various heaters, and the like) are deliberately varied by known amounts. The techniques described below may be performed with or without silicon in the crucible, and may be performed during crystal growth.

Figure 8:
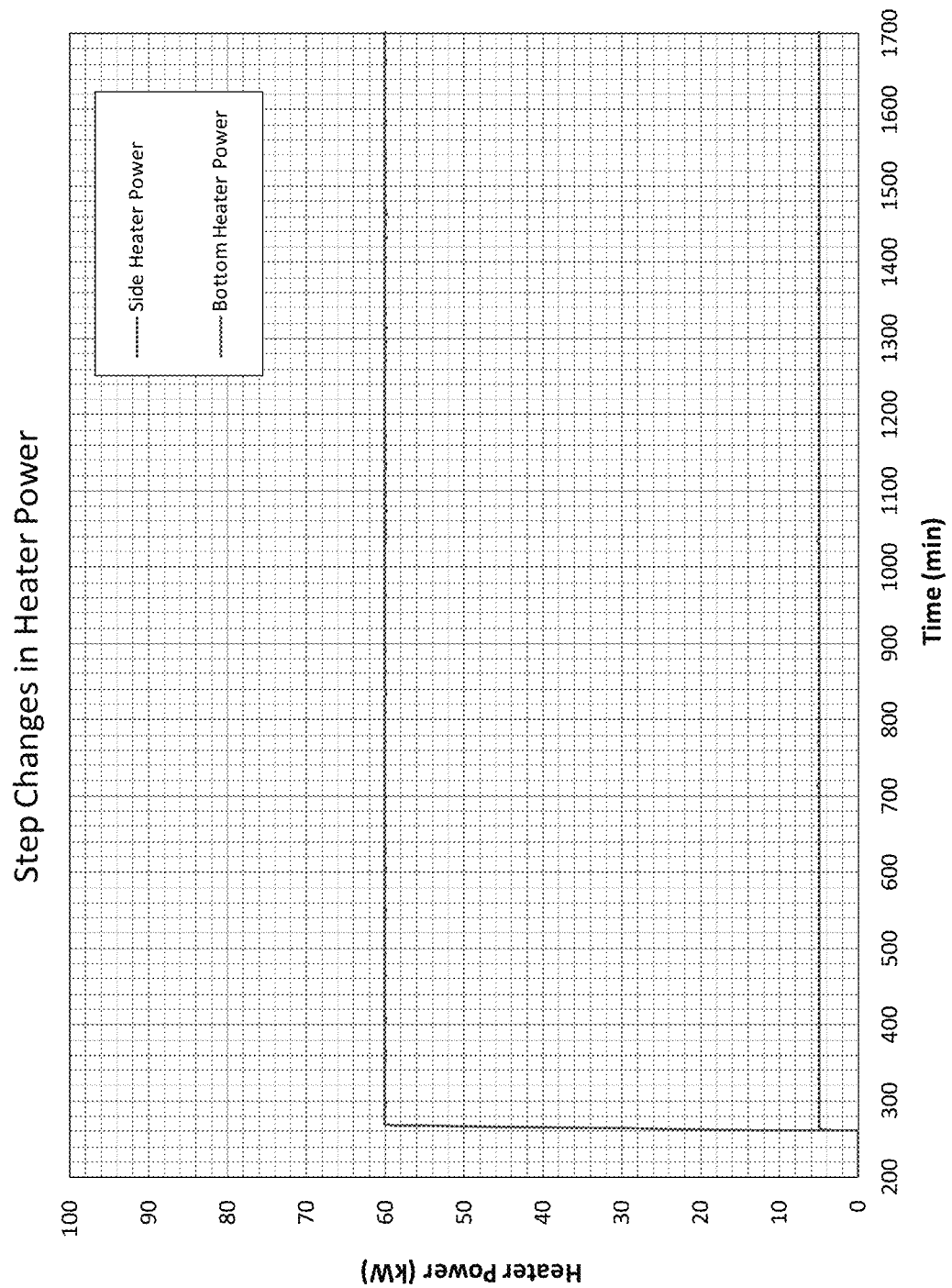
FIG. 8 is a graph showing the introduction of a step change in the power of the side heater and the bottom heater of the ingot puller apparatus.
Figure 9:
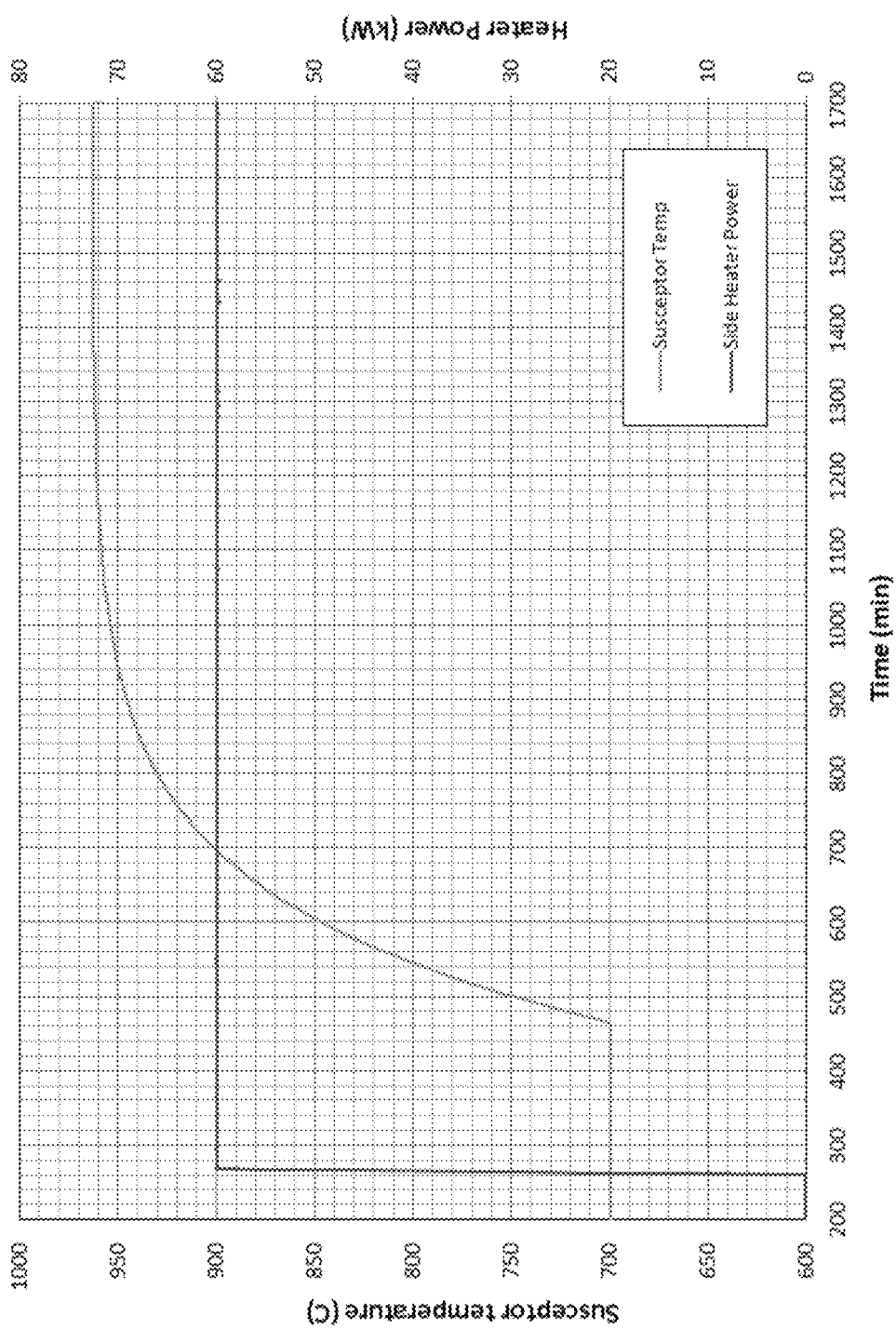
FIG. 9 is a graph of the side heater power and the temperature of the susceptor as measured by the pyrometer during the step change shown in FIG. 8.
Figure 10:
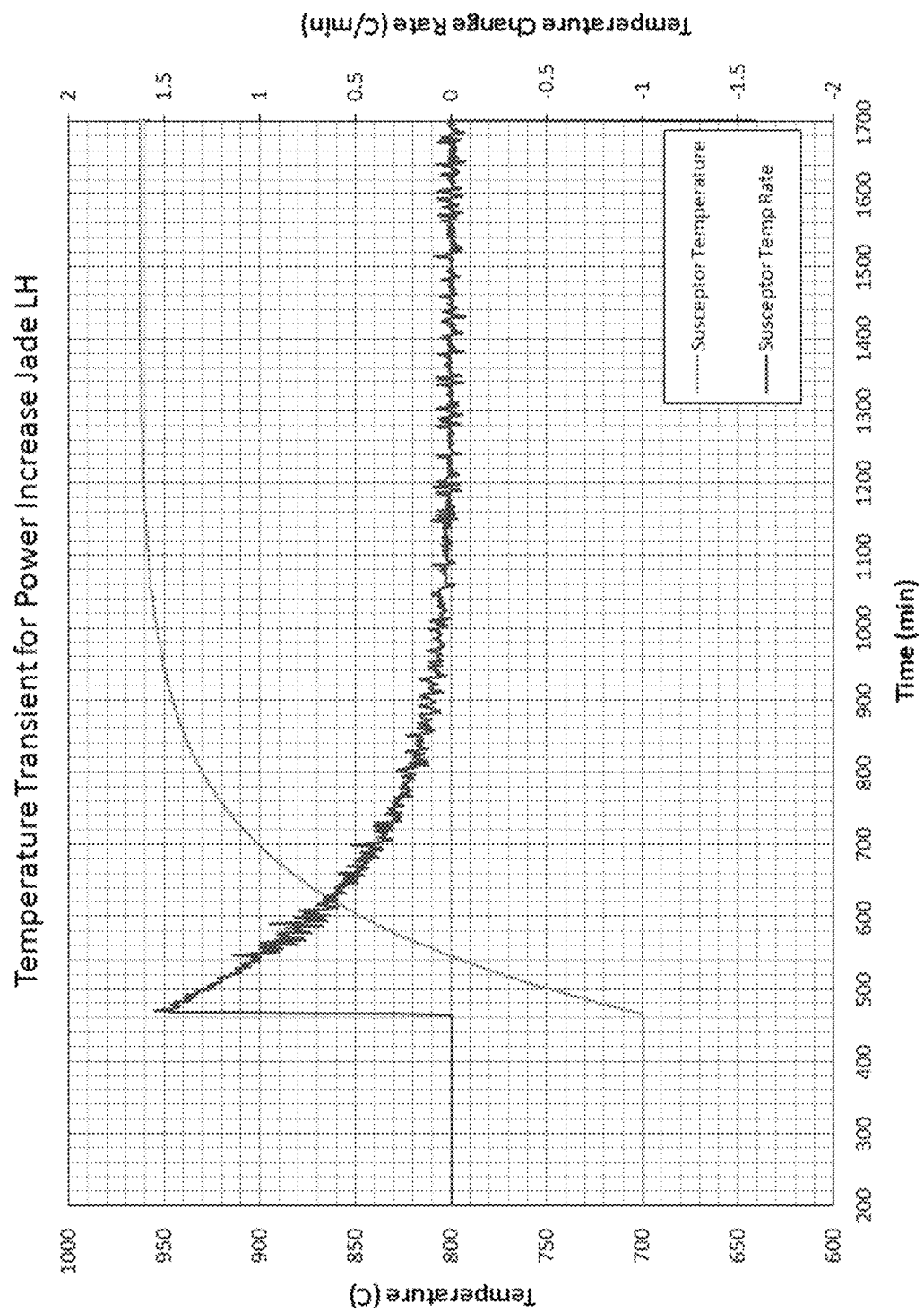
FIG. 10 is a graph of the temperature of the susceptor as measured by the pyrometer and the temperature change rate of the susceptor during the step change shown in FIG. 8.

With reference to FIGS. 8, 9, and 10, step changes in the powers of the heaters 135, 126 are introduced while the pyrometer 174 measures the temperature of the susceptor 106. FIG. 8 is a graph showing the introduction of a step change in the power of the side heater 135 and the bottom heater 126 at a time of about 260 minutes. The side heater power is increased from 0 kW to 60 kW, and the bottom heater power is increased from o kW to 5 kW. FIG. 9 is a graph of the side heater power and the temperature of the susceptor 106 as measured by the pyrometer 174. The pyrometer 174 used in this example had a lower temperature detection threshold of 700° C., therefore, no temperature data is captured below 700° C. Other embodiments may include a pyrometer 174 with temperature detection thresholds lower than 700° C. to allow additional temperature data to be captured. FIG. 10 is a graph of the temperature of the susceptor 106 as measured by the pyrometer 174 and the temperature change rate of the susceptor 106. As shown in FIG. 10, the time constant of the temperature transient caused by the step changes of side heater power from 0 kW to 60 kW and bottom heater power from 0 kW to 5 kW in this particular crystal puller 100 (using the specific heaters 126, 135, the specific susceptor 106, and the other specific components of the puller 100) is 900 minutes or 15 hours, as indicated by the decay of the rate of temperature change. Thus, it is known from the results shown in FIG. 10 that this particular change (without any other changes) will take about 15 hours to reach a substantially steady state. Further, the particular temperature at any time within that 15 hours can be calculated and predicted based on the decay of the rate of temperature change.

Figure 11:
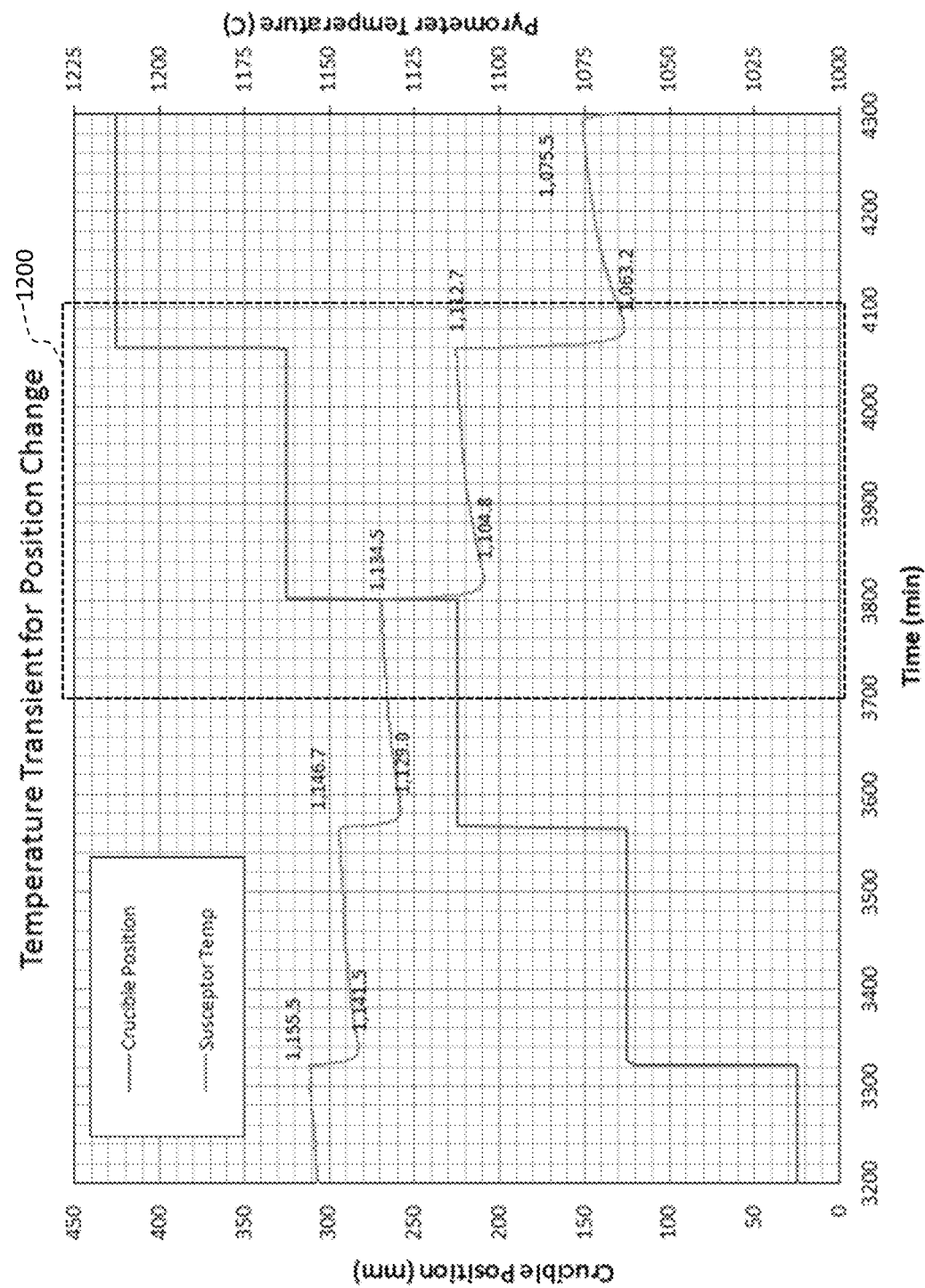
FIG. 11 is a graph of step changes in the position of the susceptor (and the crucible to which the susceptor is attached) and the temperature of the susceptor over the same time.
Figure 12:
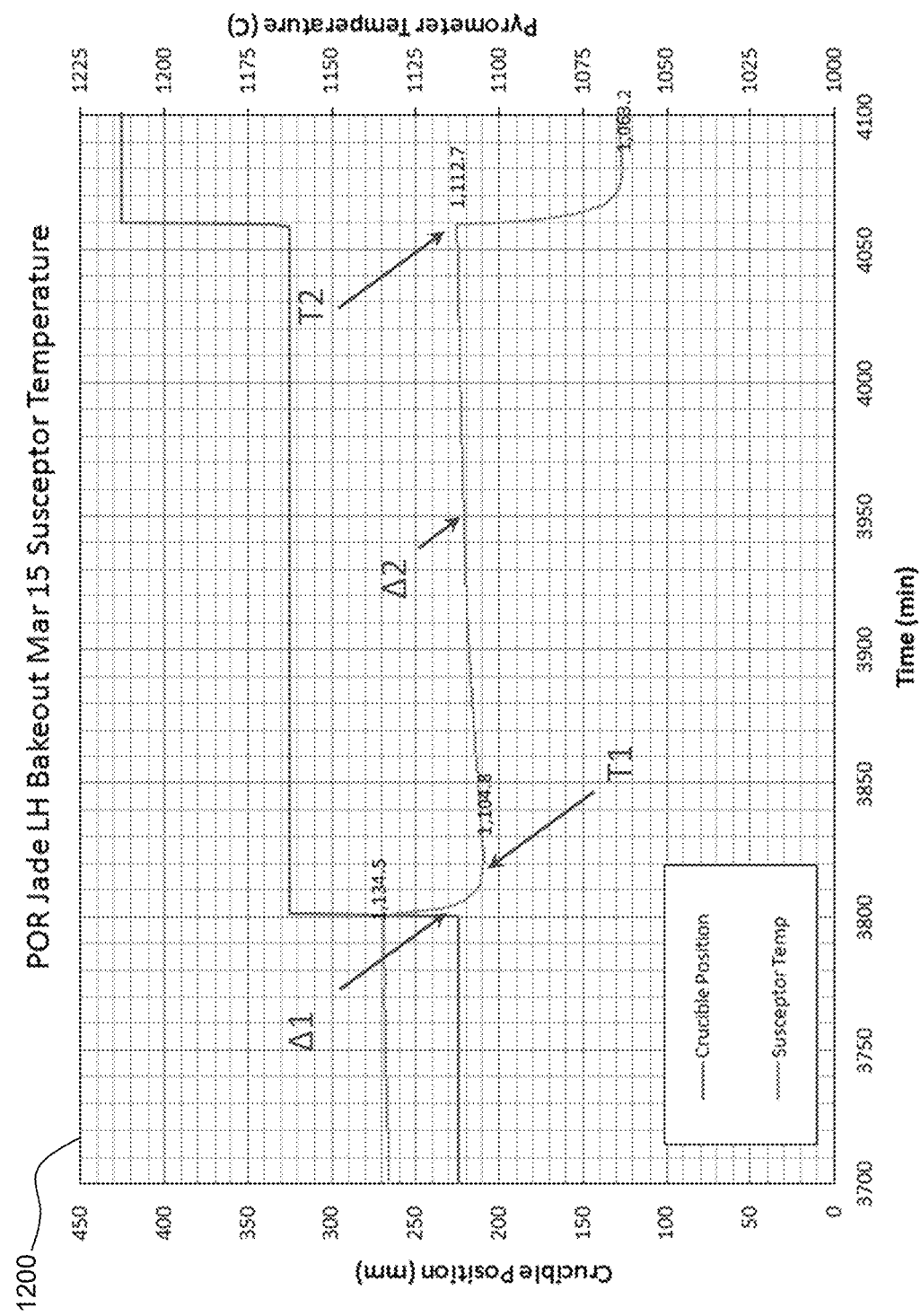
FIG. 12 is a graph of a portion of the data from FIG. 11.

Another example application of the temperature monitoring system is illustrated by FIGS. 11-14. In this application, the susceptor 106 is raised up in a series of step changes in 4 hour intervals progressively closer to the reflector 151 and cooling jacket (not shown), which are the heat shield and active cooling device in the hot zone. The step changes in the position of the susceptor 106 (determined by the position of the crucible 102 to which the susceptor 106 is attached) are shown in FIG. 11. FIG. 11 also shows the monitored temperature of the susceptor 106 as monitored by the pyrometer 174 over the time period including the step changes in the position of the susceptor 106. The region 1200 in FIG. 11 is expanded in FIG. 12. As shown in FIG. 11, the step changes create two temperature transients at each step, which are described in details in FIG. 12. T1 and T2 in FIG. 12 are the susceptor temperatures at the end of each transient, which are also the temperatures at the beginning of the next transients. $\Delta 1$, $\Delta 2$ are the differences between the susceptor temperature at the beginning and the end of each transient. At each step change, the susceptor 106 is moved closer to cooling jacket and reflector 151, and the temperature transient of the susceptor 151 is caused by the cooling effect from cooling jacket and radiation shielding effect from reflector 151. By measuring $\Delta 1$ and the time constant of $\Delta 1$, the transient characteristics caused by moving susceptor 106 towards these two parts can captured.

Figure 13:
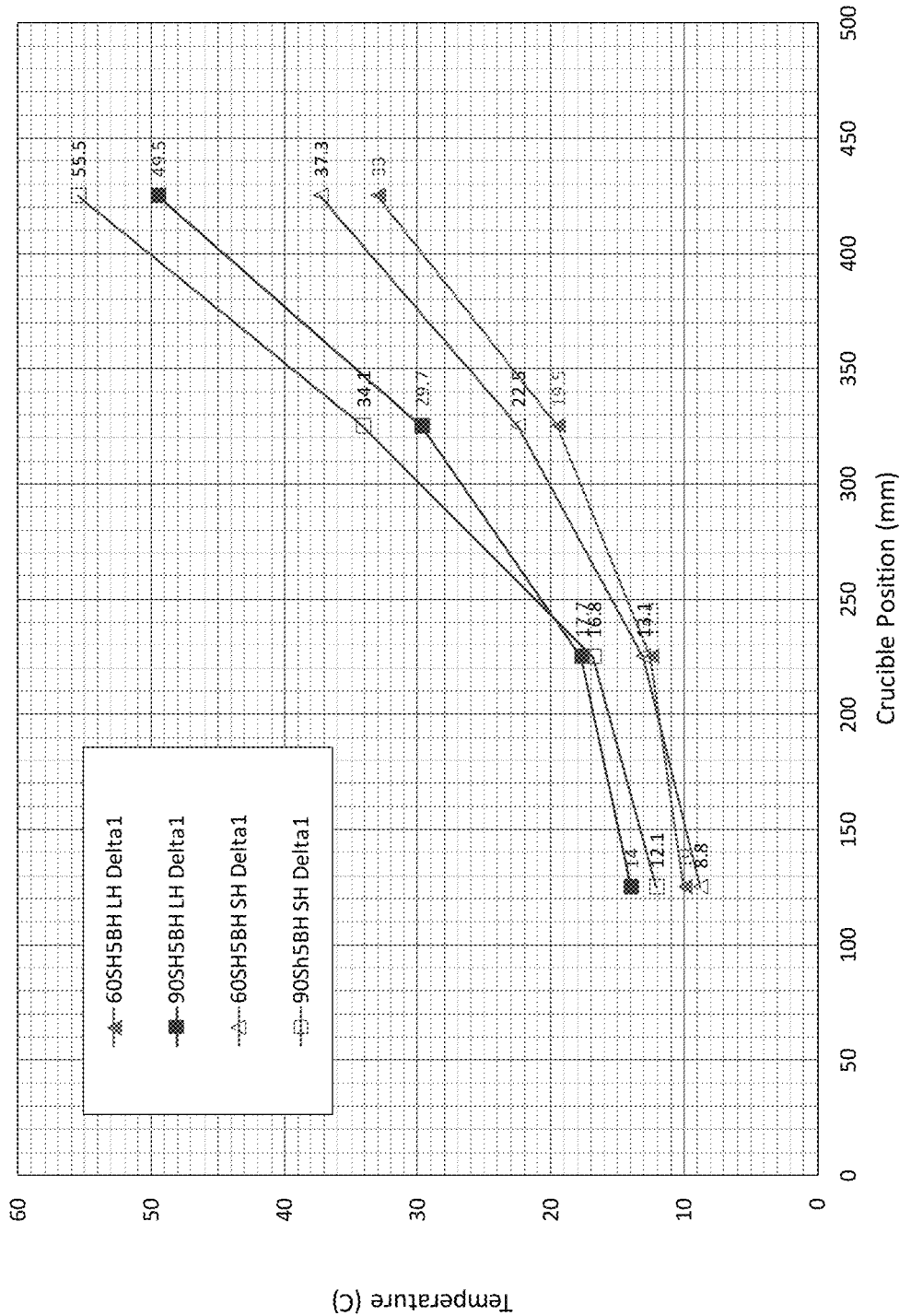
FIG. 13 is a graph of a first transient Δ1 for the two different hot zones at the two different temperature settings for ingot puller apparatuses based on the ingot puller apparatus of FIG. 1.
Figure 14:
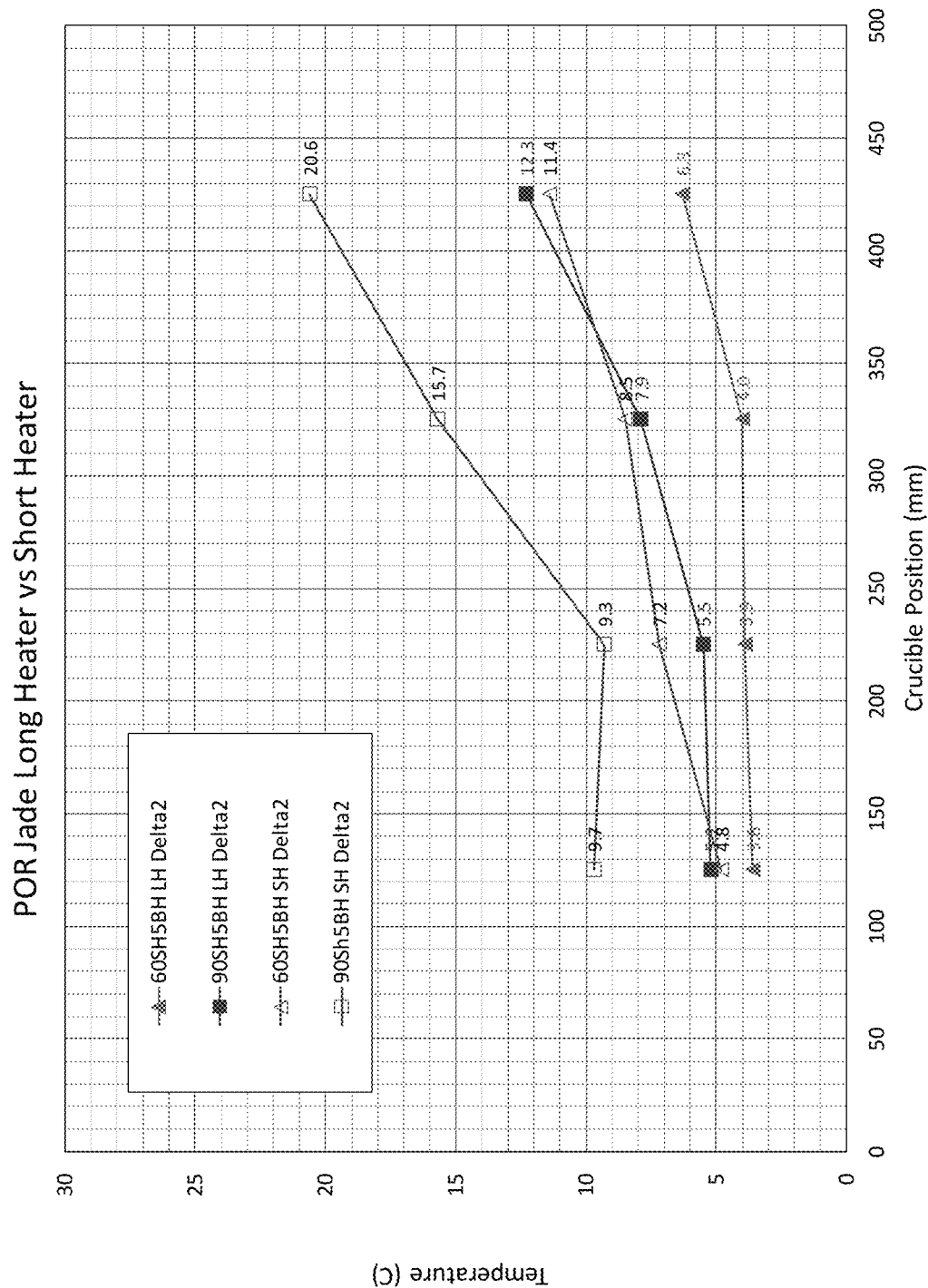
FIG. 14 is a graph of a second transient Δ2 for the two different hot zones at the two different power settings used in FIG. 13.
Figure 15:
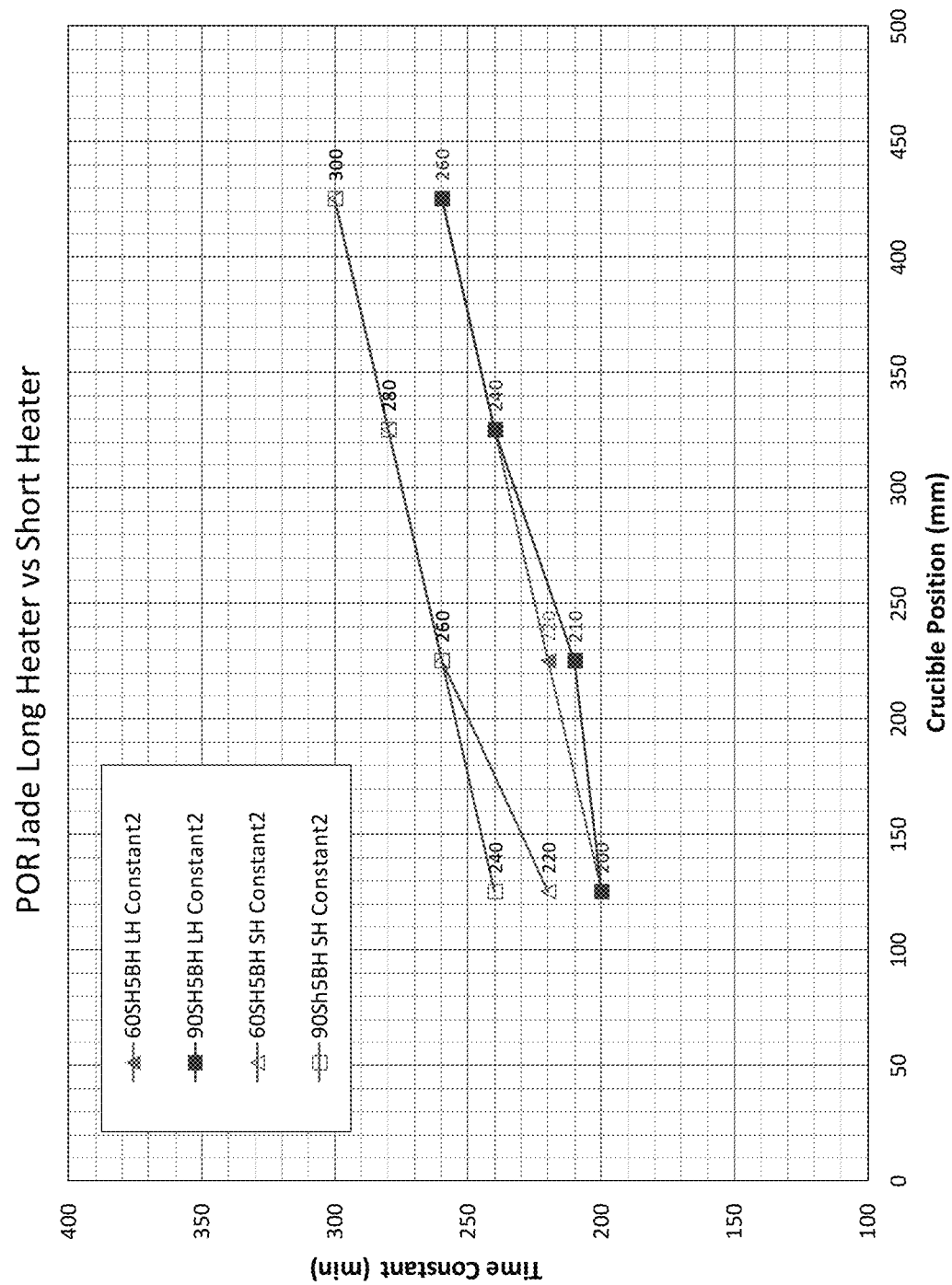
FIG. 15 is a graph of the time constant of the second transient Δ2 for the two different hot zones at the two different power settings used in FIGS. 13 and 14.

By comparing such transient characteristics among different hot zone designs, the designs that can achieve the desired efficiency can be determined. For example, the measurements described and shown above were performed for two different hot zones each at two different power settings. FIG. 13 is a graph of $\Delta 1$ for the two different hot zones (LH—long heater configuration, and SH—short heater configuration) at the two different temperature settings (60 kW side heater power and 5 kW bottom heater power; and 90 kW side heater power and 5 kW bottom heater power). As is seen, the SH configuration has larger impacts at higher crucible positions, but smaller impacts at crucible positions of 225 mm or less. The other temperature transient at each step change is caused by the nearby hot zone parts such as reflector, side insulation, etc. The temperature and position changes on the susceptor 106 in the first transient, $\Delta 1$, cause temperature changes on those nearby hot zone parts, through combination of radiation and conduction. The second transient $\Delta 2$ is the result of those parts reaching temperature equilibrium and affecting again the temperature of susceptor 106. That is, $\Delta 2$ is the change in temperature as the components of the hot zone stabilize (e.g., reach equilibrium or steady state) while the crucible 102 is held in a constant position after introducing a step change in position. FIG. 14 is a graph of $\Delta 2$ for the two different hot zones at the two different power settings. As can be seen, the SH configuration has greater impacts at all positions of the crucible and both power settings. Because the second transient $\Delta 2$ is caused by the hot zone parts undergoing temperature stabilization, its time constant (e.g., the duration of the transient) is longer and reflects the thermal characteristics of relevant hot zone parts. FIG. 15 is a graph of the time constant $\Delta 2$ for the two different hot zones at the two different power settings. As shown in FIG. 15, the SH configuration has longer transients at all positions of the crucible 102. For each configuration (SH or LH), the time constants are substantially the same for the different power settings. This shows that the power setting of the heaters 126, 135 does not significantly affect the thermal properties of materials which dominate this transient.

Although discussed above with reference to step changes in the position of the susceptor 106 (and the crucible 102 to which it is attached), the above techniques can be applied to movements, step changes, or significant changes to any components of the hot zone or any operational settings that may impact to the temperature fields. The process may be used to compare different changes affecting the same hot zone, or to compare different hot zones. Moreover, the description above relied on temperature measurements form the pyrometer, but temperature measurements from the IR camera (e.g., measurements of regions of interest not visible to the pyrometer or larger areas of interest and temperature gradients) may be similarly used. Thus, these techniques can be used to help characterize the capabilities of the hot zone and crystal growth process.

Any logic flows depicted in the figures do not require the particular order shown, or sequential order, to achieve desirable results. In addition, other steps may be provided, or steps may be eliminated, from the described flows, and other components may be added to, or removed from, the described systems. Accordingly, other embodiments are within the scope of the following claims.

It will be appreciated that the above embodiments that have been described in particular detail are merely example or possible embodiments, and that there are many other combinations, additions, or alternatives that may be included.

Also, the particular naming of the components, capitalization of terms, the attributes, data structures, or any other programming or structural aspect is not mandatory or significant, and the mechanisms that implement the disclosure or its features may have different names, formats, or protocols. Further, the system may be implemented via a combination of hardware and software, as described, or entirely in hardware elements. Also, the particular division of functionality between the various system components described herein is merely one example, and not mandatory; functions performed by a single system component may instead be performed by multiple components, and functions performed by multiple components may instead performed by a single component.

Approximating language, as used herein throughout the specification and claims, may be applied to modify any quantitative representation that could permissibly vary without resulting in a change in the basic function to which it is related. Accordingly, a value modified by a term or terms, such as "about" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise.

Various changes, modifications, and alterations in the teachings of the present disclosure may be contemplated by those skilled in the art without departing from the intended spirit and scope thereof. It is intended that the present disclosure encompass such changes and modifications.

This written description uses examples to describe the disclosure, including the best mode, and also to enable any person skilled in the art to practice the disclosure, including making and using any devices or systems and performing any incorporated methods. The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A method comprising:
   positioning a pyrometer to view a region of interest within a hot zone of a crystal puller, the hot zone of the crystal puller having a first configuration including a first plurality of components therein;
   positioning an infrared (IR) camera to view one or more additional regions of interest within the hot zone;
   controlling the crystal puller to introduce a step change to a characteristic of one or more component of the plurality of components;
   performing one or both of:
      receiving first temperature data of the region of interest within the hot zone from the pyrometer before, during, and after the step change to the characteristic is introduced; and
      receiving first IR images of the one or more additional regions of interest from the IR camera before, during, and after the step change to the characteristic is introduced;
   changing at least one component within the hot zone of the crystal puller to produce a second configuration of the hot zone having a second plurality of components;
   controlling the crystal puller to reintroduce the step change to the characteristic in the second configuration of the hot zone; and
   performing one or both of:
      receiving second temperature data of the region of interest within the hot zone from the pyrometer before, during, and after the step change to the characteristic is reintroduced to the second configuration of the hot zone; and
      receiving second IR images of the one or more additional regions of interest from the IR camera before, during, and after the step change to the characteristic is reintroduced to the second configuration of the hot zone.

2. The method of claim 1, further comprising, analyzing, using a computing device, the first temperature data and the second temperature data, the first IR images and the second IR images, or the first temperature data, the second temperature data, the first IR images, and the second IR images to compare thermal characteristics of the first configuration of the hot zone and the second configuration of the hot zone.

3. The method of claim 2, further comprising selecting the first configuration of the hot zone or the second configuration of the hot zone as having preferred thermal characteristics.

4. The method of claim 3, further comprising controlling the crystal puller to produce a silicon ingot with the selected one of the first configuration of the hot zone or the second configuration of the hot zone.

5. The method of claim 1, wherein the one or more components in the hot zone comprise a susceptor, a reflector, a crucible, a side heater, a bottom heater, a cooling jacket, and, when a silicon ingot is being produced, a silicon melt within the crucible and a silicon ingot extending from the silicon melt.

6. The method of claim 5, wherein the region of interest within the hot zone comprises a portion of the susceptor or a portion of a surface of the silicon melt.

7. The method of claim 5, wherein the one or more additional regions of interest are selected from a portion of the reflector, a portion of the silicon ingot, and a portion of a surface of the silicon melt.

8. The method of claim 5, wherein the step change to the characteristic of one or more component comprises one or more of a step change in a position of the crucible, a step change in a position of the susceptor, a step change in a power output of the side heater, a step change in a power output of the bottom heater, a step change in a position of the reflector, a step change in the position of the cooling jacket, and a change in a position of the side heater or the bottom heater.

\* \* \* \* \*